Nov. 14, 1967 R. E. MORGAN ET AL 3,353,032

FLYBACK POWER AMPLIFIER CIRCUIT

Filed June 9, 1964 6 Sheets-Sheet 1

Inventors:
Raymond E. Morgan,
Burnice D. Bedford,
by Charles W. Helzer
Their Attorney.

FLYBACK POWER AMPLIFIER CIRCUIT

Filed June 9, 1964 6 Sheets-Sheet 2

Inventors:
Raymond E. Morgan,
Burnice D. Bedford,
by Charles W. Helzer
Their Attorney.

Inventors:
Raymond E. Morgan,
Burnice D. Bedford,
by Charles W Helzer
Their Attorney.

Inventors:
Raymond E. Morgan,
Burnice D. Bedford,
by Charles W. Helzer
Their Attorney.

Nov. 14, 1967 R. E. MORGAN ET AL 3,353,032

FLYBACK POWER AMPLIFIER CIRCUIT

Filed June 9, 1964 6 Sheets-Sheet 5

Inventors:
Raymond E. Morgan,
Burnice D. Bedford,
by Charles W. Helzer
Their Attorney.

Nov. 14, 1967 R. E. MORGAN ET AL 3,353,032

FLYBACK POWER AMPLIFIER CIRCUIT

Filed June 9, 1964 6 Sheets-Sheet 6

Inventors:
Raymond E. Morgan,
Burnice D. Bedford,
by Charles W. Helzer
Their Attorney.

3,353,032

FLYBACK POWER AMPLIFIER CIRCUIT

Raymond E. Morgan, Schenectady, and Burnice D. Bedford, Scotia, N.Y., assignors to General Electric Company, a corporation of New York Filed June 9, 1964, Ser. No. 373,674
9 Claims. (Cl. 307—88.5)

ABSTRACT OF THE DISCLOSURE

A family of flyback D-C power amplifier circuits comprise a linear inductance in series with a diode or first bidirectional solid state conducting device and a load having a filter capacitor connected across it. The linear inductance is charged by a shunting unidirectional or second bidirectional solid state conducting device, and upon discharge thereof voltage amplification to a maximum of about $2E_s$ depends on the on-off ratio of the shunting device. The solid state conducting devices include the triac, diac, GTO, and *dv/dt* fired SCR. Power return to the supply is possible in circuits using first and second bidirectional conducting devices.

The present invention relates to new and improved flyback power amplifier circuits.

More particularly, the invention relates to a family of new and improved flyback power circuits employing triacs, diacs, *dv/dt* fired silicon controlled rectifiers, and gate turn-off silicon control switches as power switching elements.

The silicon controlled rectifier (SCR) made practical for the first time in the electrical power industry the widespread use of static electric power switches. The SCR is a solid state semiconductor, four-layer PNPN junction device having a gating electrode which is capable of turning on power flow through the device with only a relatively small gating signal. The conventional SCR, is a nongate turn-off device, however, in that once conduction through the device is initiated, the gate thereafter loses control over conduction through the device, and it has to be turned off by external commutation circuit means which usually operate to reverse the potential across the SCR.

In addition to the SCR, recent advances in the semiconductor art have made available to industry new solid state semiconductor power switching devices which are controlled turn-on, bidirectional conducting devices. By bidirectional conducting device is meant the device is capable of conducting electric current in either direction through the device depending upon the polarity of the potentials across the device. One of these last-mentioned devices, referred to as a triac, is a gate controlled turn-on NPNPN junction device which, similar to the SCR, is a nongate turn-off device in that it must, be turned off by external commutation circuit means. While the preferred form of the triac is a five-layer gate controlled device, it should be noted that four-layer PNPN and NPNP junction gate controlled triac devices are practical as well as other variations, but that in any event the triac characteristics mentioned above are common to all of them.

A second newly available power switching device, referred to as a power diac, is a two-terminal five-layer NPNPN junction device which like the triac has bidirectional conducting characteristics. In contrast to the SCR and the triac, however, the diac is not a gate turn-on device, but must be turned on by the application of a relatively steep voltage pulse (high *dv/dt*) applied across its load terminals. It should be noted that the SCR and triacs may also be turned on by the same high *dv/dt* firing technique. The diac, however, is similar to the SCR and triac in that it too must be turned off by external circuit commutation means.

In addition to the above-mentioned devices, a new gate turn-on, gate turn-off silicon control switch device has been made available which not only can be turned on by the application of a low current, low voltage gating signal to its turn-on gate, but it may also be turned off in the same manner.

In application Ser. No. 197,626, filed May 25, 1962, entitled, "Power Amplifier Circuits," Burnice D. Bedford, inventor, assigned to the General Electric Company, the same assignee as the present application, now Patent No. 3,263,099, granted July 26, 1966, a flyback electric power amplifier circuit is disclosed which utilizes a flyback transformer technique to achieve a load voltage step up. The power amplifier circuits disclosed in this copending application all utilized silicon controlled rectifier devices as the power switching elements. It is the purpose of the present application to disclose a whole family of new and improved flyback power amplifier circuits using a similar flyback technique, but employing the newly available solid state semiconductor power switching devices listed above.

It is therefore a primary object of the present invention to provide an entire family of new and improved flyback power amplifier circuits which employ triacs, diacs, *dv/dt* fired silicon controlled rectifiers, and gate turn-off silicon control switches as the power switching elements.

In practicing the invention, a new and improved flyback power amplifier circuit is provided which includes a linear inductance, first conductivity controlled conducting means for controlling current flow therethrough in at least one direction, and a load all connected in series circuit relationship across a pair of power supply terminals that in turn are adapted to be connected across a source of electric potential. A second conductivity controlled bidirectional conducting means is connected in parallel circuit relatiosnhip with the series connected first-mentioned conductivity controlled conducting means and the load. The new and improved flyback power amplifier circuit is completed by the provision of means for turning on and off the second conductivity controlled bidirectional conducting means at desired intervals to cause it to conduct current therethrough in a direction depending upon the polarity of the potentials across the bidirectional conducting means. In other embodiments of the invention, a gate turn-on, gate turn-off silicon control switch is substituted for the second bidirectional conducting means, and signal sources for turning on and off the silicon control switch at desired intervals are provided.

Other objects, features, and many of the attendant advantages of this invention will be appreciated more readily as the same becomes better understood by reference to the following detailed description, when considered in connection with the accompanying drawings, wherein like parts in each of the several figures are identified by the same reference character, and wherein.

Figure 11:
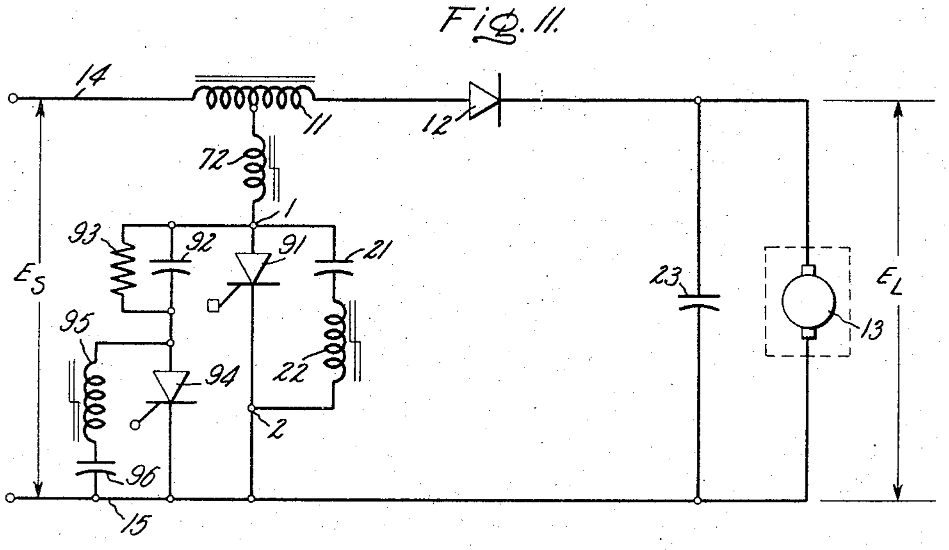
Figure 12:
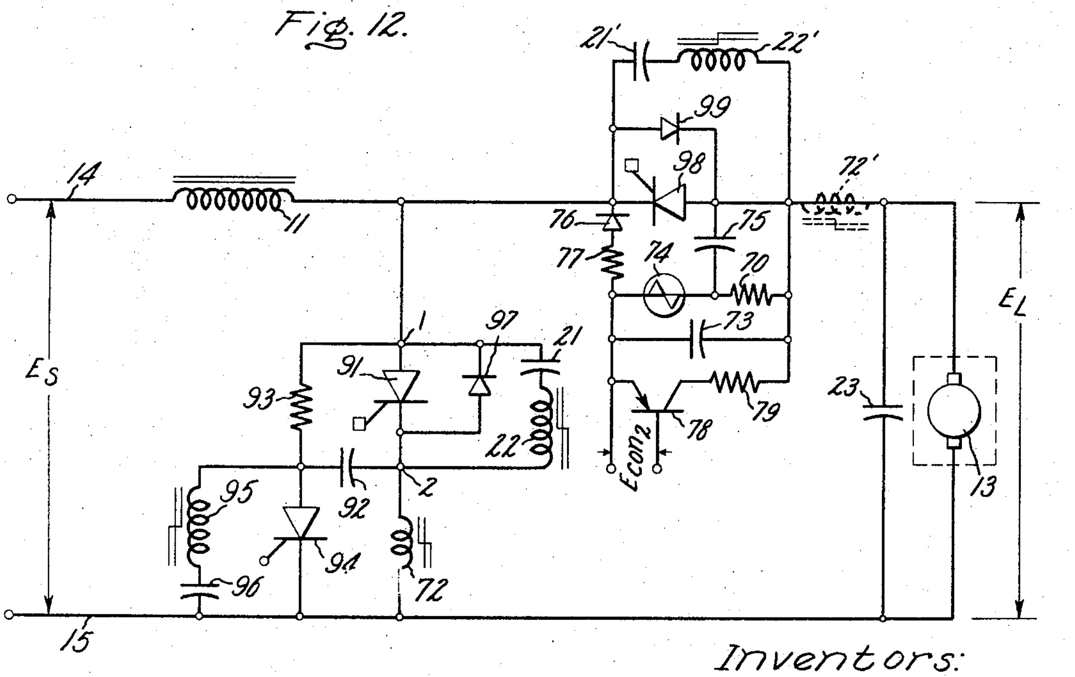

FIGURE 11 is a schematic circuit diagram of an embodiment of the invention employing a *dv/dt* fired SCR as the power switching element; and FIGURE 12 is a schematic circuit diagram of a new and improved power amplifier circuit which employs two *dv/dt* fired SCR's to provide pump back of power under conditions where the load is operating as a generator of power, as well as to supply power to the load.

Figure 1:
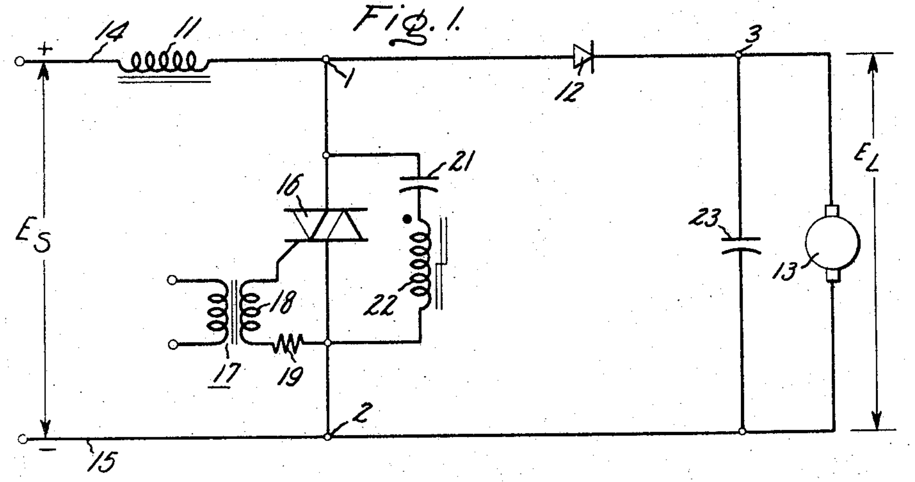
FIGURE 1 is a schematic circuit diagram of a new and improved flyback power amplifier circuit employing a triac bidirectional conducting device as the power switching element.

FIGURE 1 of the drawings shows one form of a flyback power amplifier circuit which is comprised by a linear inductance 11, a diode 12, and a load 13, all connected in series circuit relationship across a pair of power supply terminals 14 and 15 which in turn are adapted to be connected across a source of direct current electric potential. The polarities of the direct current electric potential are such that the terminal 14 is normally positive with respect to the terminal 15. The series circuit comprised by the diode 12 and the load 13 has a conductivity controlled triac bidirectional conducting device 16 connected in parallel circuit relationship with it. The triac bidirectional conducting device 16 is a gate turn-on, nongate turn-off bidirectional conducting device which has recently been introduced into the electrical industry by the Rectifier Components Department of the General Electric Company, Auburn, New York. Similar to the conventional silicon controlled rectifier (SCR), the triac may be switched from a high impedance blocking state to a low impedance conducting state by a low voltage gate signal applied between the gate terminal and one of the load terminals of the triac. It should be noted that in the case of the triac, the low voltage gating signal may be of either positive or negative polarity relative to one of its load terminals. Also, like the SCR, once the triac is switched to its low impedance conducting state, the gate electrode thereafter loses control over conduction through the device and current flow through the device must then be interrupted by some external means while the gate signal is removed in order to return the triac to its high impedance nonconducting blocking state. Unlike the SCR, however, a further characteristic of the triac 16 is that once it is gated on it will conduct current through the device in either direction depending upon the polarity of the potentials applied across the triac device. For a more detailed description of the triac bidirectional conducting device, reference is made to application note No. 200.35 issued by the Rectifier Components Department of the General Electric Company located in Auburn, New York, dated February 1964, and entitled "Triac Control For A.C. Power" by E. K. Howell. Also, see an article entitled, "Bilateral SCR Lets Designers Economize On Circuitry," by E. K. Howell, appearing in the Jan. 20, 1964, issue of Electronic Design magazine.

The triac bidirectional conducting device 16 is turned on by a gating signal applied to its control gate through a gating transformer 17 having its secondary winding 18 connected in series circuit relationship with a limiting resistor 19 between the control gate of the triac, and the load terminal thereof connected to the power supply terminal 15. In order to commutate off the triac 16 a commutating circuit is provided which is comprised by a commutating capacitor 21 and a saturable reactor winding 22 which are connected in series circuit relationship across the load terminals of the triac bidirectional conducting device 16. To complete the circuit, a filter capacitor 23 is connected in parallel circuit relationship with the load 13 for smoothing purposes.

In operation, the triac bidirectional conducting device 16 upon being turned on serves to charge the linear inductance 11, and then upon turning off to cause the inductance 11 to discharge through the load 13 and filter capacitor 23. In this manner, during successive operations of triac 16, the load voltage $E_L$ supplied to the load 13 is raised to some predetermined level higher than the supply voltage $E_s$ as determined primarily by the ratio of the on-time to the off-time of triac device 16. The value of the load voltage $E_L$ is given by the expression:

$$E_L = E_s\left(\frac{t_{sc}}{t_{so}}\right) + E_s$$

where $t_{sc}$ is the time that the bidirectional conducting triac device 16 is closed or conducting, and $t_{so}$ is the time that the triac device 16 is open or in its nonconducting blocking condition. The ratio of the time interval for which the triac device 16 is conducting to its nonconducting blocking condition is controlled by the gating signal source coupled to the terminal of gating transformer 17. So long as the triac device 16 is turned on some of the time, a load voltage $E_L$ may be obtained which always exceeds the supply voltage $E_s$. This statement assumes that the ratio $$\frac{t_{sc}}{t_{so}}$$

is greater than zero for it can be appreciated that if the triac bidirectional conducting device 16 is never turned on so that the term $t_{sc}$ equals zero, then the load voltage $E_L$ will equal the supply voltage $E_s$. In most applications, the time interval $t_{sc}$ is controlled within the range from the values of $t_{sc}$ equals zero, to $t_{sc}$ is equal to $t_{so}$ which results in providing a load voltage $E_L$ which is within the range from $E_L$ is equal to $E_s$, to $E_L$ is equal to twice $E_s$. It should be noted that the triac device 16 may be controlled in such a manner that the value of the ratio $t_{sc}/t_{so}$ is greater than 1, and as a result the load voltage $E_L$ will exceed the value $2E_s$. While it is possible to operate the circuit under these conditions, it is not preferred, however, since the switching losses occasioned by switching the triac bidirectional conducting device 16 at the rate required to obtain such a ratio, will exceed the switching losses which occur in other power amplifier arrangements such as a conventional inverter and transformer. Hence, the circuit of FIGURE 1 would be less desirable for use under such condition than the other conventional power circuit arrangements. As a consequence of these considerations, it can therefore be appreciated that the circuit shown in FIGURE 1 and described hereinafter, would generally be employed for power amplifier circuits where the load voltage $E_L$ would not normally be more than twice the supply voltage $2E_s$.

The manner in which the increase in the value of the load voltage $E_L$ is obtained can best be appreciated after a consideration of the following description. Consider that the triac device 16 is in its blocking or nonconducting condition, and that the linear inductance 11 has completed discharge of its energy through the diode 12 into load 13. At this point in the operation of the circuit, the triac 16 may again be turned on by a gating signal pulse applied to its gating electrode through gating transformer 17. Upon the triac 16 being turned on, the potential of the load terminal 1 goes essentially to the same potential as the load terminal 2 (ignoring the forward drop through triac 16 in its conducting condition) so that linear inductance 11 is charged directly from the supply voltage $E_S$ through triac 16. Under these conditions, the diode 12 will be blocking so that the energy of the smoothing capacitor 23 cannot be discharged back through triac 16. The triac 16 will continue to conduct under these conditions until such time that it is turned off by the commutation circuit means comprised by commutating capacitor 21 and saturable reactor 22.

The commutation circuit means 21 and 22 operate in the manner of the well-known Morgan commutation circuit to turn off the triac 16 after a predetermined conduction interval. For a more complete description of the manner of operation of the commutation circuit 21 and 22, reference is made to U.S. Patent No. 3,019,355 issued Jan. 30, 1962, entitled, "Magnetic Silicon Controlled Rectifier Power Amplifier," R. E. Morgan, inventor, assigned to the General Electric Company, the same assignee as the present application. For the purpose of the present description, the commutation circuit means can be briefly stated to operate as follows. During the periods that the triac 16 is in its nonconducting, blocking condition, the commutating capacitor 21 is charged positive at its no dot side, and the saturable winding 22 is driven into positive saturation so that in order to maintain the winding in the positive saturation condition, the potential across it must be positive at the dot end with respect to the no dot end. Upon the triac 16 being turned on, the charge on the commutating capacitor attempts to discharge through the reactor winding 22 and drives this winding out of positive saturation towards negative saturation. The triac 16 continues to conduct while the winding 22 is being driven into negative saturation. Upon reaching negative saturation, the charge on the commutating capacitor 21 is oscillated 180° through the series tuned circuit comprised by commutating capacitor 21 and the saturated inductance of winding 22, and the dot side of the capacitor 21 now becomes positive with respect to the no dot side. This results in again reversing the polarity of the potential across the saturable reactor winding 22 so that it is then driven out of negative saturation back towards positive saturation. During the interval of time while the winding 22 is being driven back toward positive saturation, the triac 16 continues to conduct. Upon the saturable reactor winding 22 again being driven into positive saturation, the impedance of the winding 22 drops essentially to zero so that the now reversed polarity charge across commutating capacitor 21 in effect is applied directly across the load terminals of the triac 16. This reverse polarity potential across the load terminals of triac 16 results in turning off triac 16. From this description, it therefore can be appreciated that the commutating circuit 21 and 22 performs a timing function in turning off the triac 16, and hence determines its on or conducting period. By proper design of the saturable reactor winding 22, this conducting interval can be made to be any desired time interval, and by varying the timing of the gating signal pulses applied to the gating transformer 17, the time-on versus time-off ratio $t_{sc}/t_{so}$ can be varied to thereby proportionally vary the value of the output load voltage $E_L$.

To continue with the description of the overall operation of the circuit arrangement of FIGURE 1, it should be remembered that during the conducting "on" times of the triac 16, the linear inductance 11 is being charged with current supplied from the supply voltage source $E_S$. Upon the triac 16 being turned off by the commutation circuit means 21 and 22 in the above-described manner, the magnetic lines of flux which have been built up around the linear inductance 11, will collapse and in collapsing will generate an electromotive force having a value given by the expression $$E_S\left(\frac{t_{sc}}{t_{so}}\right)$$

in Equation 1. This electromotive force in effect is connected in series circuit relationship with the supply voltage $E_S$, and gives rise to the increased value of the load voltage $E_L$ as set forth in Equation 1. The result is to drive the potential of the load terminal 1 to a value which is positive with respect to the potential across the filter capacitor 23 so that the diode 12 conducts, and applies this larger total potential $E_L$ across the load 13 and filter capacitor 23. Filter capacitor 23 then operates in the normal manner of a smoothing capacitor to somewhat smooth the ripples that would otherwise occur in the load voltage $E_L$.

During operation of the circuit shown in FIGURE 1 of the drawings, the triac 16 is self-protecting in view of its bidirectional conducting characteristic, and hence requires no safety measures which otherwise might be required if the device 16 were a unidirectional conducting device. This self-protecting feature occurs by reason of the fact that if the potentials appearing across the triac 16 during the periods of discharge of the linear inductance 11 become excessive, the device will break down and conduct current without permanent damage. Similarly, in the event of a reverse polarity potential being developed across the load terminals of the device due to the nature of the load 13, or some malfunction of the circuit, the device can break down and conduct current in the reverse direction without permanent damage. Hence, it can be appreciated that the circuit of FIGURE 1 is self-protecting without requiring additional circuit elements as would normally be the case.

Figure 2:
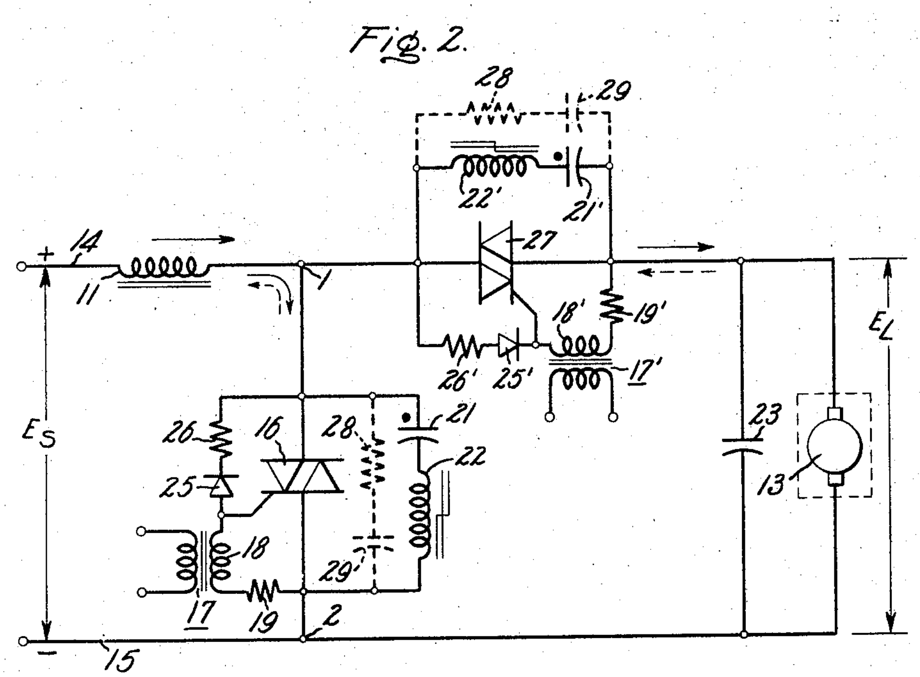
FIGURE 2 is a schematic circuit diagram of a second form of flyback power amplifier circuit employing two triac bidirectional conducting devices for not only supplying power to a load, but for pumping power from the load back into a power source during periods while the load is operating as a generator of power.

FIGURE 2 of the drawings illustrates a different form of a new and improverd flyback power amplifier circuit constructed in accordance with the invention. The circuit arrangement of FIGURE 2 is designed so that it not only supplies proportionally controlled power to the load, but is capable of pumping back power from the load 13 under those conditions of operation where the load 13 might be operating as a generator of power. Such conditions might exist, for example, if the load 13 is an electric trolley car, and the trolley car is coasting downhill. Under these conditions with the circuit such as shown in FIGURE 2, it would be possible to pump power back from the load generator 13 into the power source $E_S$ thereby realizing certain economies in the operation of the power system. In order to accomplish the above purpose, it is necessary to utilize the bidirectional conducting characteristics of the second triac bidirectional conducting device 16. For this purpose, a blocking diode 25 and limiting resistor 26 are connected in series circuit relationship between the gating electrode of triac 16 and the load terminal 1. In addition, a first triac bidirectional conducting device 27 is provided in place of the diode 12 of the circuit arrangement shown in FIGURE 1. Similar to the triac 16, the first triac bidirectional conducting device 27 has a first gating signal source connected to its control gate which is comprised by a gating transformer 17' having its secondary winding 18' connected in series circuit relationship with the limiting resistor 19' between the control gate of triac 27 and the load terminal thereof connected to load 13. A second gating signal source comprised by a blocking diode 25' and a series connected resistor 26' is connected between the control gate of triac 27 and the load terminal thereof connected to point 1. In order to commutate off the first triac bidirectional conducting device 27, commutation circuit means are provided which are comprised by a commutating capacitor 21' and saturable reactor winding 22' connected in series circuit relationship across the load terminals of the triac 27.

During the conditions of operation where load voltage $E_L$ is being supplied to the load 13 from the source of supply voltage $E_S$, the circuit of FIGURE 2 functions in substantially the same manner as the circuit arrangement of FIGURE 1. During this mode of operation, the second triac bidirectional conducting device 16 is turned on and off by the gating signal source coupled through gating transformer 17, and by the commutation circuit means 21, 22 to alternately charge the linear inductance 11 in the above-described manner. During the intervals of operation when the linear inductance 11 is discharging, the first triac bidirectional conducting device 27 is turned on by the gating signal pulse supplied through the blocking diode 25' and limiting resistor 26' to conduct current through load 13 in the direction of the solid arrow. Conduction through the triac 27 in this direction is terminated automatically upon the potential of the point 1 dropping below the potential of the point 3 at the end of the discharge of linear inductance 11. During operation of the circuit of FIGURE 2 in this manner, it can be appreciated therefore that the triac 27 functions in the place of the diode 11 of the FIGURE 1 circuit arrangement.

When the circuit of FIGURE 2 is operating under conditions where the load 13 functions as a generator, and it is desired to pump power back from the load 13 into the power source $E_S$, the circuit functions in the following manner. With the circuit of FIGURE 2 operating under these conditions, the potential of the point 3 will be positive with respect to the point 1, and it is assumed that both triacs 27 and 16 are initially in their nonconducting blocking condition. With the circuit thus conditioned, turn-on signals are supplied to the turn-on gate of the first triac bidirectional conducting device 27 through the gating transformer 17' to thereby turn on the triac 27. During the conducting period of triac 27, current will be pumped back through the linear inductance 11 into the power source $E_S$ in the direction of the dotted arrows. Conduction through the triac 27 will continue in this direction for the period of time allowed by the commutation circuit means 21' and 22' coupled across the load terminals of triac 27. This commutation circuit means operates in an identical manner to the commutation circuit means described with relation to the triac 16 to then turn off triac 27 after a predetermined conduction interval.

Upon the triac 27 being turned off, the linear inductance 11 will then function in the manner of a coasting or filter inductance to try to continue to circulate current through the power source $E_S$ due to the collapsing lines of magnetic flux built up around the turns of inductance 11. This action results in driving the potential of the point 1 negative with respect to the point 2 so that the triac device 16 is turned on by a gating signal pulse applied to its control gate through the blocking diode 25 and limiting resistor 26. Upon the triac device 16 being turned on in this manner, it will circulate the current through linear inductance 11 and power source $E_S$ in the direction of the dotted arrow in the normal manner of a coasting rectifier for the period of time required for linear inductance 11 to be discharged sufficiently for the potential of point 1 to again go positive with respect to the potential of point 2. Upon this occurrence, the triac 16 is returned to its nonconducting blocking condition, and the circuit is returned to its initial condition thereby completing one cycle of operation, and ready for a new cycle of operation. From the above description, however, it can be appreciated that while the circuit of FIGURE 2 is operated in this mode, triac 27 operates to chop the direct current potential supplied from load 13, and the triac 16 functions in the normal manner of a coasting rectifier to provide time ratio control of the direct current electric power being pumped back into the power source $E_S$.

During the operation of the circuit arrangement of FIGURE 2 in its above described second mode of operation, upon the triacs 27 and 16 being returned to their blocking condition suddenly by their associated commutation circuit means 21 and 22, respectively, the rate of reapplied voltage across each of these devices might be such as to cause them to be rendered conductive by a firing technique known as *dv/dt* firing. To avoid any such consequence in the circuit arrangement of FIGURE 2, and if the particular triac bidirectional conducting devices 27 or 16 have characteristics such that they are readily susceptible to *dv/dt* firing, circuit means may be provided for limiting the rate of rise of reapplied voltage across these devices upon their being turned off by their associated commutation circuit means. This circuit means for limiting the rate of rise of reapplied voltage across the triac devices 27 and 16 may comprise a series connected resistor 28 and capacitor 29 (shown in dotted outline form) which are connected in series circuit relationship across the load terminals of each of the triac devices 27 and 16. By the inclusion of the circuit means 28 and 29 for limiting the rate of rise of reapplied voltage across each of the triac devices 27 and 16, malfunction of the circuit due to undesired *dv/dt* firing of the triac devices 16 or 27 can be avoided.

Figure 3:
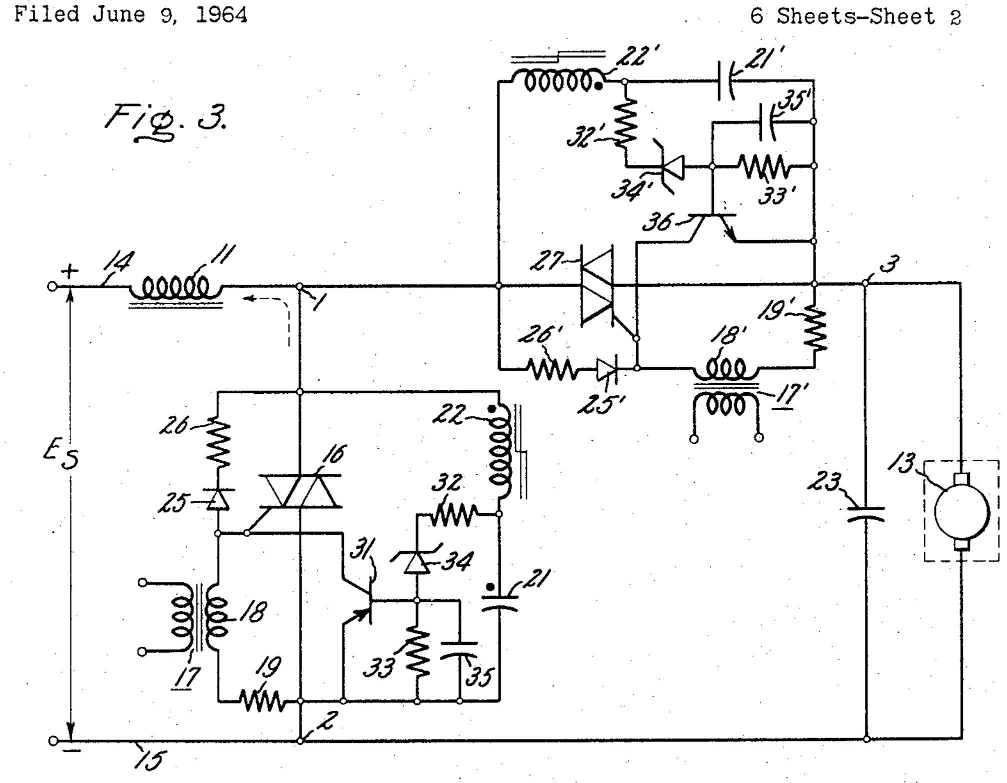
FIGURE 3 is a schematic circuit diagram of a third form of flyback power amplifier circuit similar to that of FIGURE 2, but which is somewhat more efficient in operation.

Because the modification of the circuit arrangement of FIGURE 2 described in the preceding paragraph where a parallel resistor-capacitor arrangement is used to limit the rate of rise of reapplied voltage across the two triac devices 27 and 16, introduces certain inefficiencies into the operation of the circuit, it may be desirable to restrict undesired firing of the triacs in another manner, even though more complex circuitry might be required. For this reason, the circuit arrangement of FIGURE 3 has been provided. The circuit arrangement of FIGURE 3 is substantially identical to the circuit arrangement of FIGURE 2 with the exception of the provision of lockout circuit means interconnected between the control gates of the respective triac bidirectional conducting devices 27 and 16, and their associated commutating circuit means. The lockout circuit means serve to lock out the gate of the triac to avoid undesired turn on of the triac during the commutating interval of the commutation circuit means.

For the above purpose, the circuit arrangement of FIGURE 3 includes a PNP junction transistor 31 which has its emitter-collector connected across the control gate of triac 16 to the load terminal 2. The base of PNP junction transistor 31 is connected to an intermediate point of a pair of voltage dividing resistors 32 and 33 connected in series circuit relationship with a zener diode 34 across the commutating capacitor 21. The resistor 33 has a small capacitor 35 connected in parallel circuit relationship with it to provide for a small holding period with respect to the potential developed across the resistor 33. A similar lockout circuit arrangement is provided for the triac device 27 with the exception that an NPN junction transistor 36 is employed in place of the PNP junction transistor 31 used in conjunction with triac 16. This change is necessitated by the difference in the polarity of the potentials appearing across the commutating capacitors 21 and 21'. In all other respects, the lockout circuits are constructed to operate identically.

Consider now the effect of the lockout circuit means 31 through 35 in conjunction with the operation of the circuit of FIGURE 3 as was described in connection with FIGURE 2 of the drawings. During the mode of operation of the circuit of FIGURE 3 when the load 13 is operating as a load generator, and the triac 16 merely functions as a coasting rectifier, the lockout circuit does not come into effect, since the commutation circuit means 21, 22 does not operate to turn off triac 16. Instead, while operating in this mode, upon the potential of the point 1 automatically rising above the potential of the point 2 following discharge of inductance 11, the triac 16 automatically will be commutated off in the coasting rectifier current direction as indicated by the dotted arrows. However, when the circuit of FIGURE 3 is being operated in the mode where it supplies load current to the load 13, the commutating circuit means 21, 22 is used to turn off triac 16, and the lockout circuit means 31 through 35 comes into play.

As explained in connection with FIGURE 1 of the drawings, the commutating circuit means 21, 22 starts off initially with the dot side of capacitor 21 charged positively with respect to the no dot side. Subsequently, half way through the commutating interval, the polarity of the charge on the commutating capacitor 21 is reversed so that the dot side of capacitor 21 now becomes negative with respect to the no dot side. With the circuit in this condition, a potential is fed back across the voltage dividing network comprised by resistors 32 and 33 and zener diode 34 which turns on PNP junction transistor 31. The capacit or 35 is charged by this potential, and serves to retain the negative polarity potential on the base of the transistor 31 for a sufficiently long period of time to complete commutation as described previously. As a consequence of the negative potential applied to the base of the transistor 31, this transistor is maintained full on and serves to clamp the gate of triac 16 to the potential of the load terminal 2 of the triac thereby assuring against any undesired application of a relative gate to load terminal firing potential across triac 16 during the commutating interval as the triac 16 is commutated off and is returned to its nonconducting and blocking condition. The lockout circuit arrangement 32' through 35' associated with triac 27 functions in precisely the same manner with the exception that the polarity of the potential required for operation of the NPN junction transistor 36 is reversed. Otherwise, the two circuits function in the same manner, and operate to prevent any undesired turning on of the triac 16 during the commutating interval of the commutation circuit means associated with the two triac devices.

Figure 4:
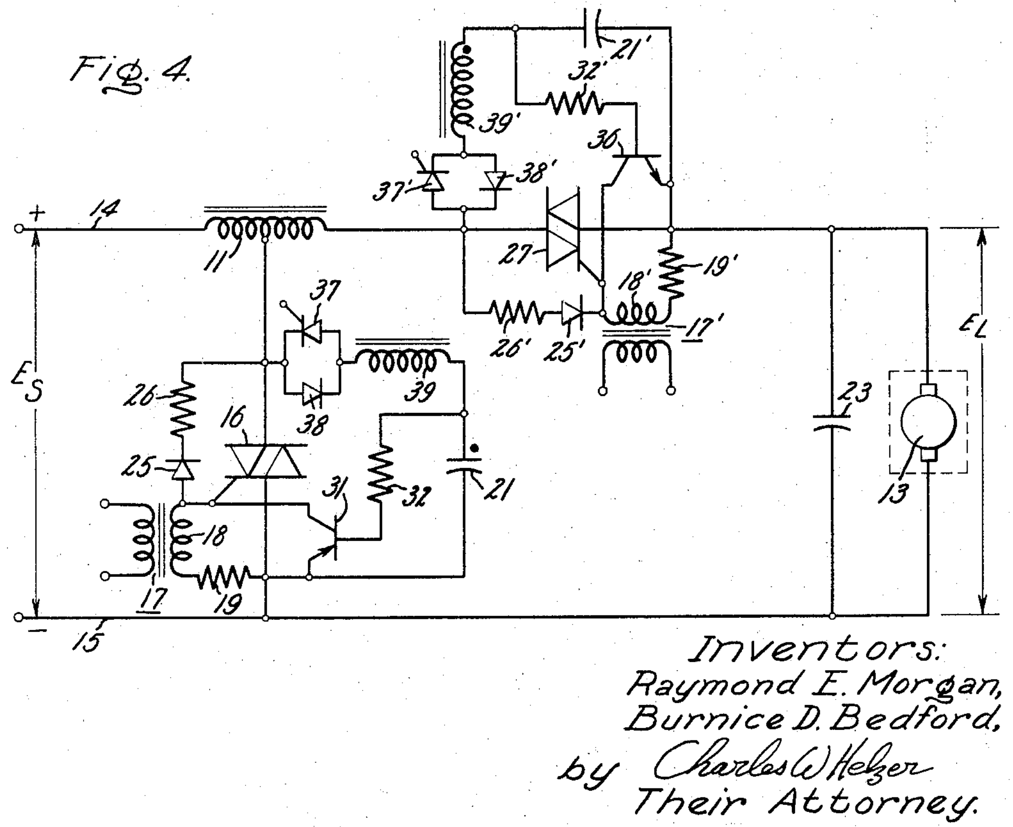
FIGURE 4 is a schematic circuit diagram of a fourth form of flyback power amplifier circuit employing two triac bidirectional conducting devices, but utilizing a different commutation circuit arrangement for turning off the triac devices at desired intervals.

FIGURE 4 of the drawings illustrates a form of a new and improved flyback power circuit arrangement which is similar in many respects to the circuit arrangements of FIGURES 2 and 3 with the exception that the second triac bidirectional conducting device 16 is connected to an intermediate tap point on the linear inductance 11. By reason of the connection of the circuit in this manner, the linear inductance 11 will operate in the form of an autotransformer to provide a further step up of the output load voltage $E_L$ with respect to the supply voltage $E_s$. In addition to the autotransformer connection, the circuit arrangement of FIGURE 4 further distinguishes from the FIGURE 2 and FIGURE 3 circuits in the form of commutation employed. The circuit arrangement of FIGURE 4 utilizes an additional SCR 37 having a feedback diode 38 connected in parallel circuit relationship in a reverse polarity sense. The parallel connected auxiliary SCR 37 and feedback diode 38 are connected in series circuit relationship with a linear inductance 39 and commutating capacitor 21 across the load terminals of the triac bidirectional conducting device 16. The commutating circuit means connected across the triac bidirectional conducting device 27 is identical in construction and operation, and hence the following description of the manner of operation of the commutating circuit means is applicable to both commutation circuits.

The commutation circuit comprised by the auxiliary SCR 37 and feedback diode 38 in conjunction with linear inductance 39 and commutating capacitor 21 operates in accordance with the well-known "McMurray" commutation technique to turn off the triac 16 (or triac 27) after a desired conduction interval. With this arrangement, the dot side of commutating capacitor 21 will be charged positively through the diode 38 during the intervals when triac 16 is in its nonconducting or blocking condition. Upon the triac 16 being gated on, the diode 38 and auxiliary SCR prevent discharge of the capacitor 21. After a desired conducting interval of the triac 16, and at the time when it is desired to turn off triac 16, an auxiliary gating signal pulse is applied to the gating electrode of the auxiliary SCR 37 to turn it on. Upon auxiliary SCR 37 being turned on, the charge on the commutating capacitor 21 is oscillated 180° through the series tuned circuit comprised by capacitor 21 and linear inductance 39 which are tuned to series resonance at the desired commutating frequency. This results in reversing the polarity of the charge on the commutating capacitor 21 so that it now becomes negative at the dot side of the capacitor. As a consequence of the reversal of polarity of the charge on capacitor 21, the auxiliary SCR 37 will be automatically commutated off, and this reverse polarity potential will be coupled back through the feedback diode 38 to reverse the polarity of the potential across the triac 16 and cause it to turn off. During this commutation interval, the PNP junction transistor 31 is turned on to clamp the control gate of triac 16 to its load terminal potential thereby assuring against inadvertent turn on of the triac during the commutating interval. The commutation circuit means 21', 39', 37', and 38' associated with triac 27 as well as the lockout circuit means 32' and 36 function in the same manner with the exception that the reverse polarity of the initial charge on the commutating capacitor 21' necessitates the use of NPN junction transistor 36 in place of the PNP junction transistor 31. Otherwise, the two circuits function in the same manner to turn off their associated triacs 16 or 27.

Figure 5:
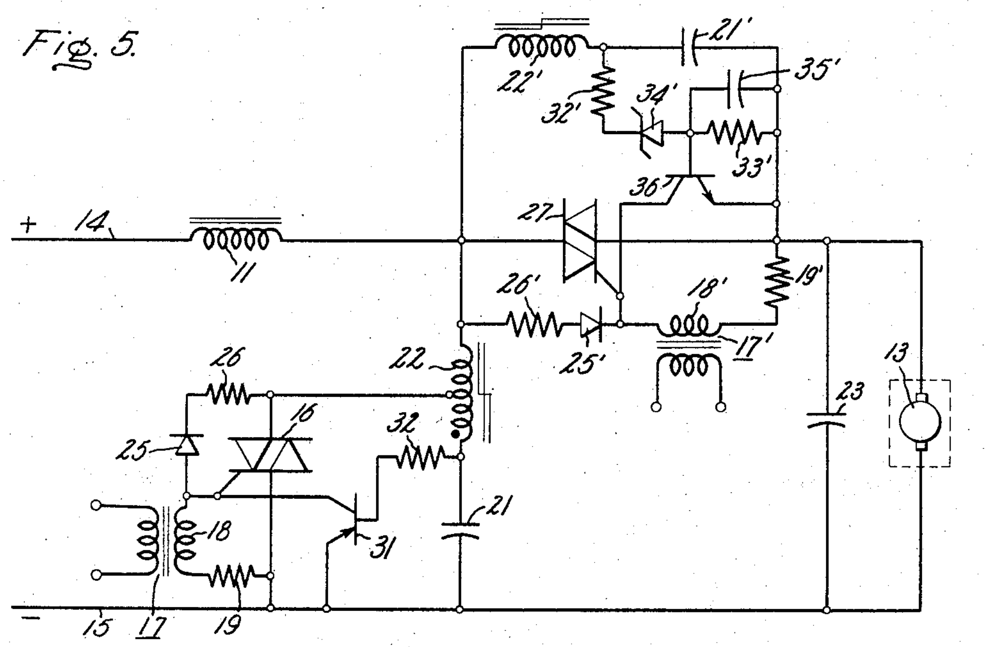
FIGURE 5 is still a fifth form of new and improved flyback power amplifier circuit constructed in accordance with the invention, and which utilizes still a different form of commutation circuit to turn off the power switching triacs employed in the circuit.

The new and improved flyback power circuit arrangement shown in FIGURE 5 is identical to the circuit arrangement of FIGURE 3 with the exception that the second bidirectional conducting triac device 16 is connected to an intermediate tap point of the commutating saturable reactor 22. By reason of the connection of the saturable reactor 22 in this manner, the current flowing through the second bidirectional conducting triac device 16 flows through at least part of the windings of the saturable reactor 22. As a result of this connection, winding 22 operates as an autotransformer and the charge on the commutating capacitor 21 is transformed up to a higher value than the voltage of the power supply source $E_s$. As a consequence of the commutating capacitor 21 being charged to a higher value, greater assurance is provided that the second triac bidirectional conducting device 16 will be commutated off at higher values of load voltage $E_L$. For a more complete description of the manner of operation of the commutation circuit means 21 and 22 employed in the circuit arrangement of FIGURE 5, reference is made to the above-identified Morgan Patent No. 3,019,355.

Figure 6:
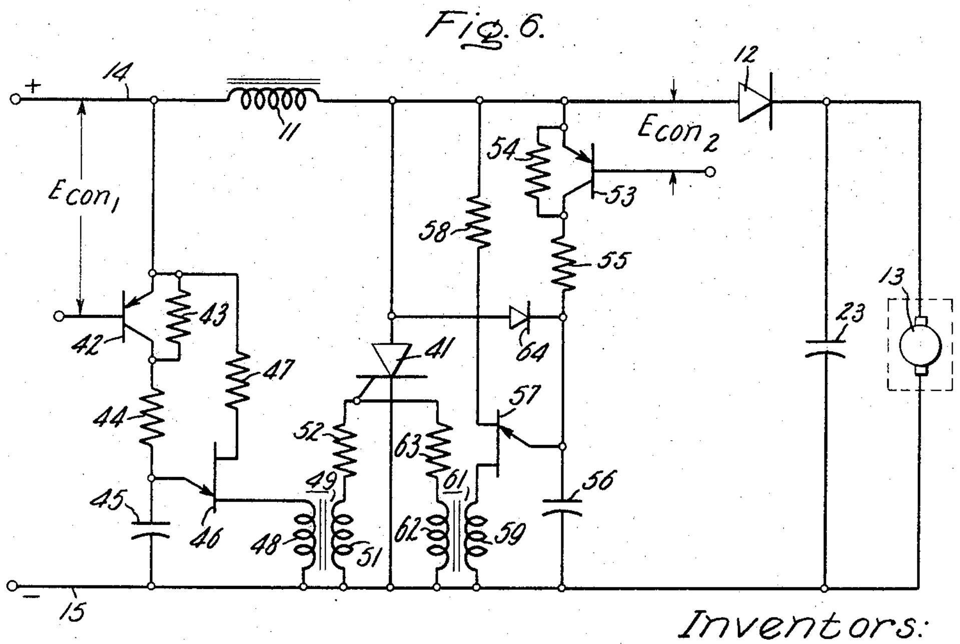
FIGURE 6 is a schematic circuit diagram of a form of a new and improved flyback power amplifier circuit which utilizes silicon control switches.

FIGURE 6 of the drawings illustrates still a different form of the new and improved flyback power circuit arrangement constructed in accordance with the invention. In the form of the invention shown in FIGURE 6, a gate turn-on, gate turn-off silicon control switch device 41 (sometimes referred to as a gate turn-off silicon controlled rectifier) is provided as the power switching element. For a more detailed description of the silicon control switch device 41, reference is made to Chapter 19 of the Transistor Manual, published by the Semiconductor Products Department of the General Electric Company located at Electronics Park, Syracuse, New York, copyrighted in 1962. Briefly, however, it can be stated that the silicon control switch device 41 is a device which can be turned "on" to its conductive low impedance state by the application of a low voltage gating signal to one of its control gates, and also may be turned "off" to its nonconducting blocking condition by the application of a low voltage turn-off signal to either the same control gate, or to a second turn-off control gate that is provided in some forms of the device. In the embodiment of the invention shown in FIGURE 6 of the drawings, a silicon control switch device 41 is employed which has only a single control gate to which both the "gating-on" and the "gating-off" signals are applied.

To turn the silicon control switch device 41 on, a source of first gating signal $E_{con_1}$ is connected to the base electrode of a PNP junction transistor 42. The transistor 42 is connected in parallel circuit relationship with a resistor 43, and the parallel connected transitor 42 and resistor 43 in turn are connected in series circuit relationship with a resistor 44 and capacitor 45 across the power supply terminals 14 and 15. By this arrangement, the control signal $E_{con_1}$ applied to the base electrode of transistor 42 varies the rate of charge of the capacitor 45. The capacitor 45 is connected to the emitter electrode of a unijunction transistor 46 having one of its base electrodes connected through a limiting resistor 47 to the power supply terminal 14, and having its remaining base electrode connected to the remaining power supply terminal 15 through the primary winding 48 of a pulse transformer 49. By this arrangement, upon the charge on capacitor 45 reaching a predetermined firing level, unijunction transistor 46 will be turned, on, and will produce a gating-on pulse in the secondary winding 51 of pulse transformer 49. This gating-on pulse is supplied by the secondary winding 51 through voltage limiting resistor 52 to the control gate of a silicon control switch device 41. Accordingly, it can be appreciated that the first source of control voltage $E_{con1}$ controls turn on of the silicon control switch 41.

In order to turn off the silicon control switch 41, a source of second gating pulse signal $E_{con_2}$ is connected to the base electrode of a PNP junction transistor 53. Transistor 53 is connected in parallel circuit relationship with a resistor 54 with the parallel circuit thus comprised being connected in series circuit relationship with a resistor 55 and capacitor 56 across power supply terminals 14 and 15. By this arrangement, transistor 53 varies the rate of charge of the capacitor 56. Capacitor 56 is connected to the emitter electrode of a unijunction transistor 57 having one of its base electrodes connected through a limiting resistor 58 to the power supply terminal 14, and having its remaining base electrode coupled to the remaining power supply terminal 15 through the primary winding 59 of a pulse transformer 61. It should be noted, however, that the base electrode connections of unijunction transistor 57 are reversed with respect to the unijunction transistor 46. As a consequence, negative polarity turn-off gating pulses are developed in the secondary winding 62 which are supplied back through a limiting resistor 63 to the gating electrode of the silicon control switch 41 to turn off the silicon control switch 41. In order to isolate the gating-off circuit from the silicon control switch 41 during its periods of conduction, a blocking diode 64 is provided which is connected between the collector electrode of the silicon control switch 41 and the juncture of the resistor 55 and charging capacitor 56. Since the gating-off circuit functions in precisely the same manner as the gating-on circuit with the exception of the reversal of polarity of the gating signal pulses generated, a further description of its manner of operation is believed unnecessary. It can be appreciated, however, that by properly proportioning the two control voltages $E_{con_1}$ and $E_{con_2}$, the silicon control switch 41 can be turned on and off at desired intervals to develop any desired value load voltage $E_L$ across the load 13 in accordance with the principles outlined in connection with the description of the operation of the circuit shown in FIGURE 1 of the drawings.

Figure 7:
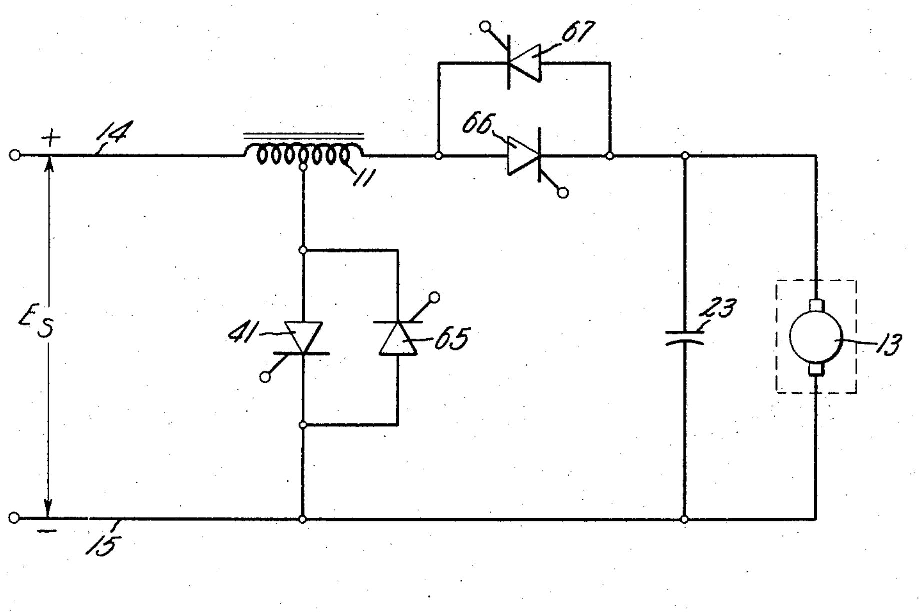
FIGURE 7 is a schematic circuit diagram of a flyback power amplifier circuit employing a dual arrangement of silicon control switch devices to supply power to the load and to pump back power from the load to the power source.

FIGURE 7 of the drawings illustrates a modification of the circuit of FIGURE 6 wherein it is possible to operate the circuit in a manner not only to supply load current to the load 13 from the supply voltage source $E_s$, but also to pump power back from the load 13 when it is operated as a generator to the power source $E_s$ for purposes of economy. For this reason, the silicon control switch device 41 has a second silicon control switch device 65 connected in parallel circuit relationship with it in a reverse polarity sense. Further, in place of the diode 12 of the circuit arrangement of FIGURE 6, a second set of parallel connected silicon control switch devices 66 and 67 connected in a reverse polarity sense are inserted in place of the diode 12. It should be noted that gating-on circuit and a gating-off circuit will be connected to the control gates of each of the silicon control switch devices 41, 65, 66, and 67 which gating-on and gating-off circuits would be similar in construction to the gating-on and gating-off circuits described with relation to the circuit arrangement of FIGURE 6. However, in order not to unduly complicate the circuit illustration shown in FIGURE 7, the gating-on and gating-off circuit arrangements have been omitted since the manner of their connection to the appropriate silicon control switch devices is believed to be obvious from FIGURE 6 of the drawings. Further, it is to be noted that the parallel connected silicon control switch devices 41 and 65 are connected to an intermediate tap point of the linear inductance 11 in a manner similar to the circuit arrangement of FIGURE 4. By connection of linear inductance 11 in this manner, it is possible to obtain a further auto-transformer voltage transformation from inductance 11.

In operation, it can be appreciated that by appropriately gating on and off the silicon control switches 41 and 66 a higher value load voltage $E_L$ may be supplied to the load 13 from a power supply source $E_s$ as explained more fully in connection with FIGURE 1. Where it is desired to pump power back from the load generator 13 into the power source $E_s$, the silicon control switch devices 65 and 67 are gated on and off in substantially the same sequence as was first described with relation to the circuit arrangement of FIGURE 2 of the drawings. Hence, a further description of this mode of operation of the circuit of FIGURE 7 is believed unnecessary.

Figure 8:
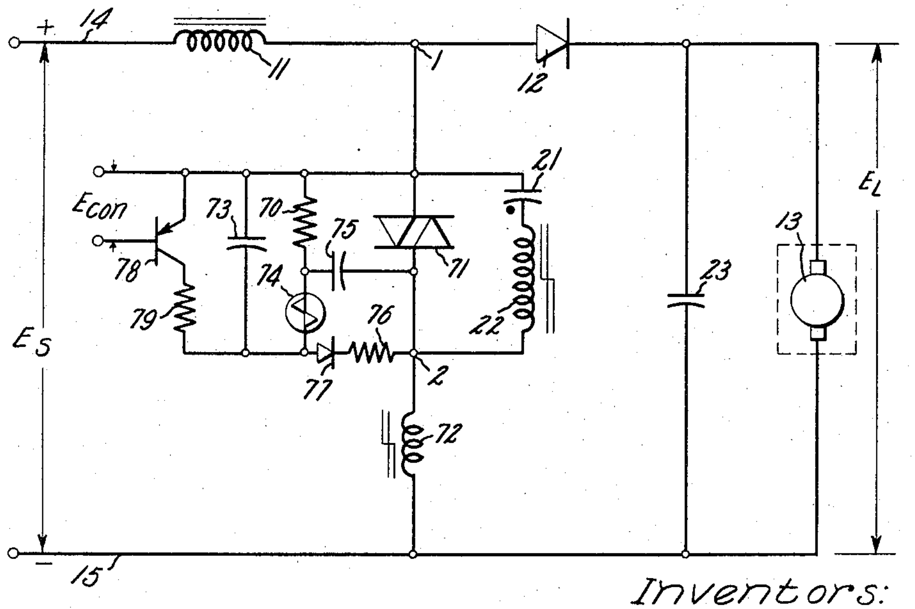
FIGURE 8 is a detailed circuit diagram of a new and improved flyback power amplifier circuit employing a diac as a power switching element.

FIGURE 8 of the drawings illustrates an embodiment of the new and improved flyback power amplifier circuit arrangement which employs a diac bidirectional conducting device 71. For a more detailed description of the diac bidirectional conducting device 71, reference is made to an article appearing in the Journal of Applied Physics, Vol. 30, No. 11, November 1959, entitled, "Two-Terminal Asymmetrical and Symmetrical Silicon Negative Resistance Switches," by R. W. Aldrich and N. Holonyak, Jr. Briefly, however, it can be stated that the diac 71 employed in the circuit arrangement of FIGURE 8 is a bidirectional conducting NPNPN five-layer junction semiconductor device capable of conducting large currents on the order of 50 or 100 amperes or larger in either one of two directions through the device depending upon the polarity of the potentials applied across the device. The power diac 71 is triggered from its blocking or nonconducting condition to its on or high conductance condition by the application of a steep wave front voltage pulse (high $dv/dt$) applied across its load terminals, and is turned off by an external commutation circuit means similar to the conventional silicon controlled rectifier. In the circuit arrangement of FIGURE 8, the power diac bidirectional conducting device 71 is connected in series circuit relationship with a small saturable reactor 72, and the series circuit thus comprised is connected in parallel circuit relationship with the series connected load 13 and diode 12. This parallel circuit arrangement then is connected through the linear inductance 11 across the power supply terminals 14 and 15 to which the direct current power supply is connected.

In order to turn on the power diac 71, a gating-on circuit arrangement is provided which is comprised by a first firing capacitor 73, a snap switch device 74, and a second firing capacitor 75, all connected in series circuit relationship across the load terminals of the power diac device 71. The snap switch device 74 may comprise a signal diac manufactured and sold by the Rectifier Components Department of the General Electric Company, Auburn, N.Y., a Hunt diode manufactured and sold by the Hunt Electric Company, or a "Bi-Switch" manufactured and sold by Transitron Electronic Corporation of Wakefield, Mass. All of these devices are low voltage-low current devices which are capable of being triggered "on" into a conducting state by raising the potential across the device above a predetermined firing potential, and which will revert to their initial nonconducting or blocking condition upon the potential across the device being lowered below its predetermined firing level. The gating signal circuit for power diac 71 is completed by a resistor 70 connected between the load terminal 1 of power diac 71 and the juncture of the snap switch device 74 and capacitor 75. A second resistor 76 and series connected blocking diode 77 is connected between the load terminal 2 of power diac 71 and the juncture of the capacitor 73 with the snap switch device 74. In order to control the firing of the power diac device 71, a PNP junction transistor 78 is connected in series circuit relationship with a limiting resistor 79 across the capacitor 73. By this arrangement, varying the conductance of the transistor 78 varies the rate of charge of the capacitor 73 to thereby vary the time of turn on of the snap switch device 74. Turn off of the power diac 71 is accomplished by the commutation circuit means comprised by commutating capacitor 21 and saturable reactor 22 connected in series circuit relationship across the load terminals of the diac 71.

In operation, the circuit of FIGURE 8 functions in a manner similar to the circuit of FIGURE 1 to achieve step up of the load voltage $E_L$ applied to load 13 from the supply voltage source $E_s$. This is achieved by alternately turning on and off the power diac device 71 in a manner similar to the circuit of FIGURE 1. It can be appreciated that with the circuit arrangement of FIGURE 8, as the potential across the charging capacitor 73 builds up, the snap switch device 74 will be turned on. Upon the snap switch device 74 being turned on, the two capacitors 73 and 75 will be effectively connected in series circuit relationship across the load terminals of the power diac device 71. This action results in driving the load terminal 2 of power diac device 71 sharply negative with respect to its load terminal 1. During the turn-on period, the small saturable reactor winding 72 connected in series circuit relationship with power diac 71 will hold off the firing potential for a short period of time prior to its being saturated. During this short hold-off period, the power diac device 71 will be turned on and rendered conductive. Subsequently, as the charge on the capacitors 73 and 75 leaks off, the voltage across the capacitor 73 will drop below the firing potential of the snap switch device 74 so that it reassumes its nonconducting or blocking condition. Thereafter, the two capacitors 73 and 75 will again be charged up to essentially the full potential of the supply voltage $E_s$ ready for a new firing operation.

In order to control the rate of charge of the capacitor 73, a control voltage $E_{con}$ is applied to the base of PNP transistor 78. After turn on of the power diac device 71 in the above-described manner, the commutating circuit 21 and 22 operates in the manner described with relation to the circuit of FIGURE 1 of the drawings to turn off the power diac device. By varying the value of the control voltage $E_{con}$ applied to transistor 78, the rate of turn on of the power diac device 71 can be varied to thereby proportionally vary the value of the load voltage $E_L$ supplied to load 13. It should be noted, that similar to the triac 16 employed in the circuit arrangement of FIGURE 1, the power diac 71 is self-protecting in that if the potential across the device becomes too large, it automatically breaks down and conducts current without permanent damage to the device. As a consequence, no extraneous protective circuit measures are required to prevent permanent damage to the power diac 71.

Figure 9:
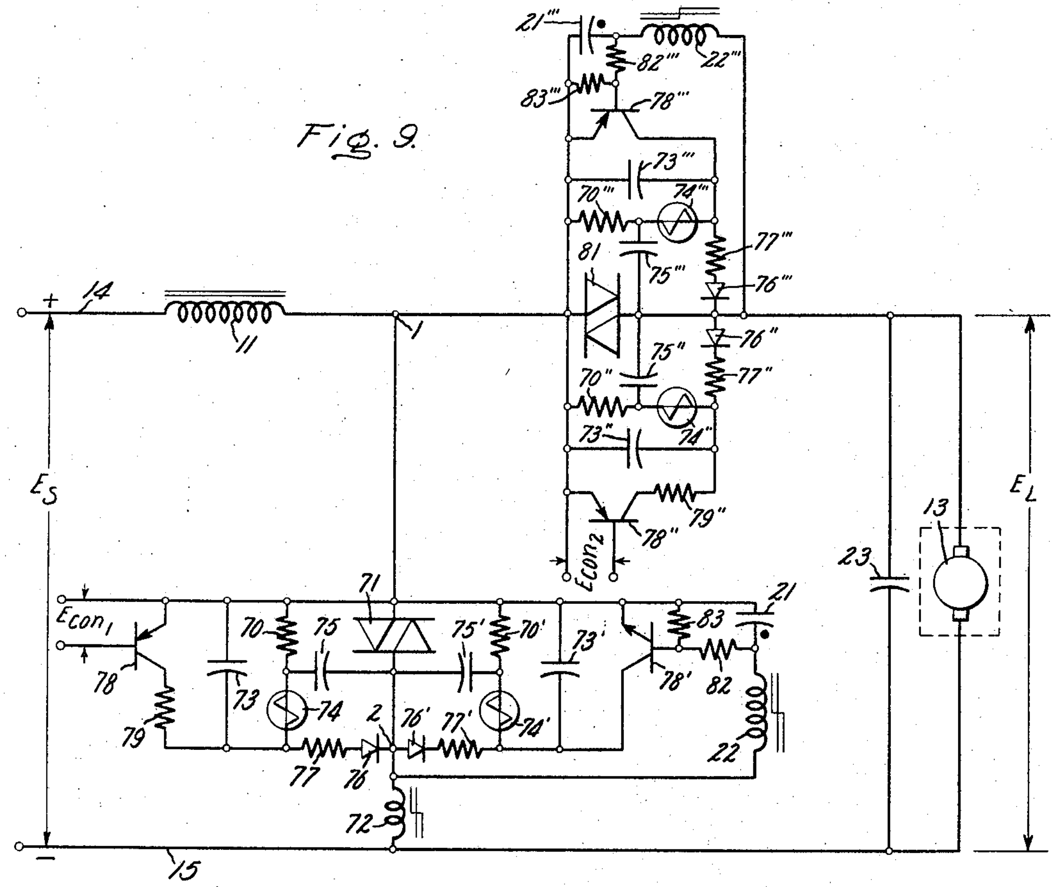
FIGURE 9 is a detailed circuit diagram of a new and improved flyback power amplifier circuit employing two diacs to provide power to the load and to pump back power from the load to the power source.

FIGURE 9 of the drawings illustrates an embodiment of the new and improved flyback power circuit arrangement employing diacs as power switching elements, and which utilize the bidirectional current capabilities of the diac to provide not only voltage step up for the load voltage, but to pump power back from the load under those conditions of operation when it is acting as a generator. For this purpose, a bidirectional power diac 81 is provided in place of the diode 12 of the circuit arrangement of FIGURE 8. Hence, diac 81 is connected in series circuit relationship with the linear inductance 11 and the load 13 across the power supply terminals 14 and 15. Both power diac devices 71 and 81 are provided with first gating circuit means as well as commutation circuit means, and in addition are provided additional or second gating circuit means for gating on the diac devices in the reverse current pumpback direction. For this purpose, power diac device 71, for example, is provided with a second or additional gating circuit means comprised by the elements 70' and 73' through 78' all of which elements correspond exactly to the similarly numbered reference numerals of the gating circuit means described with relation to FIGURE 8, and used to turn on the power diac 71 in the load voltage supply direction. The second or additional gating circuit means comprised by the elements 70' and 73' through 78' serve to turn on the diac 71 in the reverse or pumpback current direction. In addition a blocking circuit means is provided which is comprised by a pair of resistors 82 and 83 connected in series circuit relationship across the commutating capacitor 21, and whose juncture is connected to the base of the transistor 78'. By this arrangement, the transistor 78' is turned full on to clamp out the gating circuit means comprised by elements 70' and 73' through 78' during the commutating intervals of the commutating circuit means 21 and 22. It should also be noted that during the intervals that the gating circuit comprised by elements 73 through 78 is active to turn on the diac 71 in a load voltage supply direction, the diode 76' blocks any firing potential to the charging capacitor 73' so that the additional or second firing circuit means is rendered inoperative. Similarly, during those intervals where the second or additional firing circuit means comprised by elements 73' through 78' is active to turn on the diac 71, the blocking diode 76 prevents any activation of the first firing circuit means comprised by elements 73 through 78.

The power diac bidirectional conducting device 81 has a similar first firing circuit means connected thereacross which is comprised by the elements 70'' and 73'' through 79'' for turning on the diac in the reverse or pumpback direction. A second or additional firing circuit means comprised by the elements 70''' and 73''' through 78''', is provided for the turning on the power diac 81 in the low voltage supplying direction. To assure that the power diac 81 is not improperly turned on, the transistor 78''' in the second or additional firing circuit means has its base electrode connected to a lockout circuit comprised by series connected resistors 82''' and 83''' similar to the arrangement described with relation to power diac 71.

By construction of the circuit arrangement of FIGURE 9 in the above manner, the circuit can be operated in two modes to supply a stepped-up load voltage $E_L$ to the load 13, or alternatively, it can be operated in the second mode where the load 13 is operating as a generator to pump power back to the power source $E_S$. When operating in a manner to supply load voltage $E_L$ to the load 13, the power diac 71 is turned on by the first firing circuit means comprised by elements 70 and 73 through 79, and is commutated off by its commutation circuit means 21 and 22. With diac 71 operating in this manner, the power diac 81 is turned on by its second or additional firing circuit means comprised by elements 70''' and 73''' through 78''' to function in the same manner as the diode 12 in the circuit arrangement of FIGURE 8 or FIGURE 1. The first gating circuit means for triac 81 comprised by elements 73'' through 79'' is prevented from interfering with operation of the circuit by the blocking diode 76''. Similarly, the second or additional firing circuit means comprised by elements 73' through 78' associated with power diac 71 is prevented from interfering in the operation of the circuit by the lockout circuit means comprised by resistors 82 and 83 and transistor 78′.

If it is desired to operate the circuit arrangement of FIGURE 9 in a manner to pump back power from the load 13 which acts as a generator, then the power diac 81 is turned on by its first gating circuit means comprised by elements 70″ and 73″ through 79″, and is turned off by its commutation circuit means 21‴ and 22‴. Under these conditions of operation, the power diac 71 is turned on its reverse or pumpback current direction by its second or additional firing circuit means comprised by elements 70′ and 73′ through 78′. During operation of the circuit in this manner, the first firing circuit means for power diac 71 is prevented from interfering with operation of the circuits by blocking diode 76, and the second or additional firing circuit means associated with power diac 81 is prevented from interfering with operation of the circuit by the lockout circuits comprised by resistors 82‴ and 83‴ and transistor 78‴.

From the foregoing description, it can be appreciated that the circuit arrangement of FIGURE 9 is designed to perform the same dual function as the circuit arrangement of FIGURE 2, but is somewhat more complex because of the firing circuitry required to turn on the power diac devices 71 and 81. The additional circuit complexity, may be justified in certain applications, where high frequency operation is desired. The higher frequency capability of the circuit of FIGURE 9 is obtained by reason of the inherent characteristics of the power diacs 81 and 71. Power diacs 81 and 71 are avalanche operated devices in that they are rendered fully conductive across their entire cross section almost instantaneously at the time of the application of a firing potential across their load terminals. This is in contrast to the triac devices 27 and 16 employed in the circuit arrangement of FIGURE 2, for example, since the triac device is a gate-operated device, and a certain finite time period is required for the conduction caused by the gate to grow across the entire cross section of the triac device. Accordingly, it can be appreciated that the circuit arrangement of FIGURE 9 has certain inherent operating advantages not obtainable with the circuit of FIGURE 2, which would make it more desirable for use in certain applications.

Figure 10:
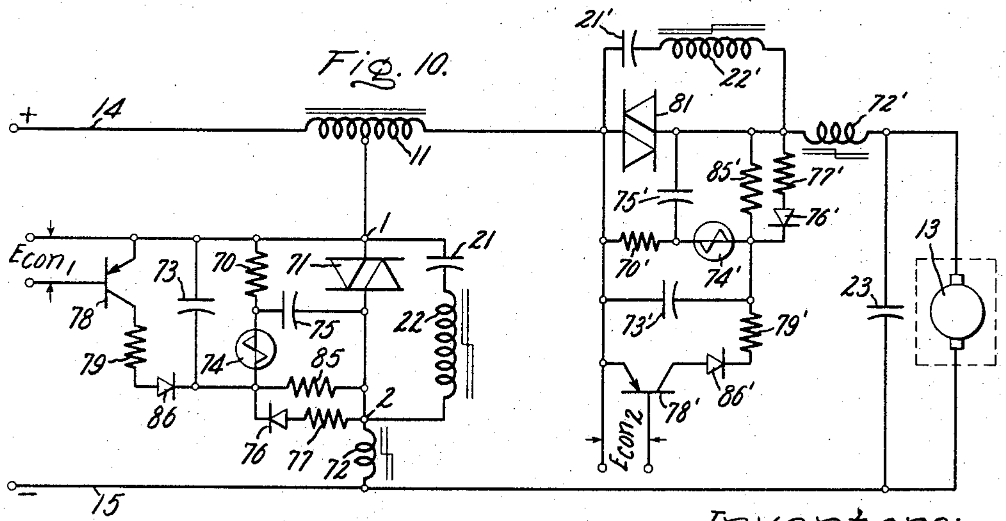
FIGURE 10 illustrates a version of the new and improved flyback power amplifier circuit which provides higher voltage step-up ratio than otherwise might be obtainable.

FIGURE 10 of the drawings illustrate a form of flyback power amplifier circuit shown in FIGURE 9 wherein the second diac bidirectional conducting device 71 is connected to an intermediate tap point on the linear inductance 11 so as to obtain autotransformer action in stepping up the load voltage $E_L$. In addition, the first and second firing circuit means used to turn on the power diac devices 71 and 81 in either direction depending upon the polarity of the potentials across the device, are consolidated into a single circuit arrangement utilizing common components. By this means, some circuit simplification is obtained. In order to obtain this circuit simplification, it is necessary to insert an additional resistor 85 connected to the load terminal 2 of the power diac 71 and to the juncture of the snap switch device 74 with the diode 76. In addition, a second blocking diode 86 is provided which is connected in series circuit relationship with the control transistor 78 and limiting resistor 79 across the charging capacitor 73. By this expedient, resistor 85, diode 86, and transistor 78 coact to vary the charge on firing capacitor 73 during the intervals of operation where diac 71 is conducting current in the load voltage supplying direction. During the intervals of operation when the diac 71 is operating as a coasting rectifier to supply current in the pumpback direction, the diode 86 blocks current, and diode 76 serves to charge capacitor 73 to the firing potential of the snap switch device 74. In all other respects, the circuit of FIGURE 10 functions in the same manner as FIGURE 9 to supply either a stepped-up load voltage $E_L$ across the load 13, or to pump power back from the load 13 to the power source for purposes of economy. It might be noted, that the firing circuit arrangement associated with the power diac device 81 is similar in construction and operates in the same manner as the firing circuit arrangement associated with power diac 71. Additionally, it is noted that a small saturable reactor 72′ is connected in the load current carrying circuit in series circuit relationship with load 13, power diac 81, and linear inductance 11. The small saturable reactor 72′ may be inserted in order to assure proper turn on of the power diac device 81, and by proper design it will not introduce too large a loss so as to greatly impair the efficiency of the overall circuit arrangement.

FIGURE 11 of the drawings illustrates an embodiment of the new and improved flyback power amplifier circuit which utilizes a *dv/dt* fired SCR 91 having its gate open-circuited. The *dv/dt* fired SCR 91 is connected in series circuit relationship with a small saturable reactor 72 to an intermediate tap point on the linear inductor 11, and the linear inductor 11 is connected in series circuit relationship with a load 13 and diode 12 across the power supply terminals 14 and 15. The *dv/dt* fired SCR 91 has a conventional Morgan commutation circuit means comprised by the commutating capacitor 21 and saturable reactor winding 22 connected in series circuit relationship across its load terminals. In order to turn on the *dv/dt* fired SCR 91, a firing circuit arrangement is provided which is comprised by a parallel connected capacitor 92 and resistor 93 connected in series circuit relationship with an auxiliary firing SCR 94 of a lower voltage rating than *dv/dt* fired SCR 91. The auxiliary firing SCR 94 has a source of suitable gating signals (not shown) connected to its control gate, and has a Morgan commutation circuit comprised by saturable reactor winding 95 and a commutating capacitor 96 connected in series circuit relationship across its load terminals.

In operation, the firing capacitor 92 which is charged essentially to the full potential of the power supply $E_s$ will be connected across the loan terminals of the *dv/dt* fired SCR 91 upon the auxiliary SCR 94 being turned on by the source of gating signals connected to its control gate. This results in driving the load terminal 1 of the *dv/dt* fired SCR 91 sharply positive with respect to its load terminal 2 so that the SCR 91 is rendered conductive almost instantaneously across its full cross section in an avalanche fashion. The commutating circuit 21 and 22 connected across the load terminals of *dv/dt* fired SCR 91 then functions in the manner described with relation to the circuit shown in FIGURE 1 to turn off the SCR 91. Similarly, the commutation circuit 95 and 96 associated with the auxiliary turning on SCR 94 operates to turn off the auxiliary SCR 94. It should be noted that during turn on of the *dv/dt* fired SCR 91, the small saturable reactor 72 will hold off the potential of the load terminal 1 for a sufficient period of time to render the *dv/dt* fired SCR 91 fully conductive. Thereafter, it saturates and introduces little or no undesired impedance into the circuit. It should also be noted, that when firing the *dv/dt* fired SCR 91 in this manner, the *dv/dt* fired SCR 91 functions in the same way as power diac device with the exception that it is unidirectional conducting instead of bidirectional conducting. Accordingly, it can be appreciated that a power diac could be inserted bodily in place of the *dv/dt* fired SCR 91 in the circuit arrangement of FIGURE 11 and the circuit would operate equally well. Conversely, if desired a *dv/dt* fired SCR could be substituted bodily for the power diac device 71 of the circuit arrangement shown in FIGURE 8 and that circuit similarly would function equally as well with the exception that it would not be self-protecting.

FIGURE 12 illustrates an embodiment of the circuit arrangement shown in FIGURE 11 which is capable of supplying power in both directions in the manner of the circuits of FIGURES 2 through 5, 9 and 10. Additionally, there is a further distinction in that the switching *dv/dt* fired SCR 91 is not connected to an intermediate tap point on the linear inductance 11, and hence does not provide the autotransformer action. In order to provide for a reverse feedback current around the *dv/dt* fired SCR 91, a feedback diode 97 is connected in parallel circuit relationship with the *dv/dt* fired SCR 91 in a reverse polarity sense. In all other respects, the circuit will operate in the same manner as the *dv/dt* fired SCR 91 described with relation to the circuit shown in FIGURE 11. It should be noted, however, that the firing capacitor 92 is connected to the load terminal 2 in the circuit arrangement of FIGURE 12 as is the small saturable reactor winding 72. As a consequence of this connection, the firing circuit will serve to drive the emitter electrode (which corresponds to the load terminal 2) sharply negative with respect to the load terminal 1 to thereby cause the *dv/dt* fired SCR 91 to turn on. This is in contrast to the circuit arrangement of FIGURE 11 which drives the load terminal 1 sharply positive with respect to the load terminal 2. It can be appreciated therefore that it does not matter how the firing voltage pulse is applied across the *dv/dt* fired SCR 91 so long as it does serve to sharply raise the potential across the device to thereby render it conductive in an avalanche fashion.

In addition to the above differences, it should be noted that a second *dv/dt* fired SCR 98 and associated reverse polarity parallel connected feedback diode 99 are substituted in place of the diode rectifier 12 in the circuit arrangement of FIGURE 11. The *dv/dt* fired SCR 98 has connected across its load terminals a firing circuit arrangement similar to that described in detail with relation to FIGURE 8 of the drawings, and hence need not be again described in detail. In addition, a commutation circuit means 21′ and 22′ is connected across the load terminals of the *dv/dt* fired SCR 98, and if desired, a small saturable reactor winding 72′ may be connected in series circuit relationship with the *dv/dt* fired SCR 98, load 13, and linear inductance 11 without unduly impairing the efficiency of the circuit.

With the circuit arrangement of FIGURE 12 constructed in the above-described manner, the circuit can be operated to supply load voltage $E_L$ to the load 13 which is substantially larger than the supply voltage $E_s$, or if desired may be operated in the mode to pump power back from the load 13 into the power supply source $E_s$ for purposes of economy. When operating the circuit of FIGURE 12 to supply load voltage $E_L$ to load 13, the *dv/dt* fired SCR 91 is turned on by its firing circuit means 92 through 96, and is commutated off by its associated commutating circuit means. Load current is supplied to the load 13 through the feedback diode 99 around the *dv/dt* fired SCR 98. When operating the circuit arrangement of FIGURE 12 to pump power back from the load 13 to the power source $E_s$, the *dv/dt* fired SCR 98 is turned on by its associated firing circuit means 73 through 78 while the small saturable reactor winding 72′ serves to assure proper turn on of the *dv/dt* fired SCR 98. The *dv/dt* fired SCR 98 is then commutated off by its associated commutation circuit means 21′ and 22′, the operation of which was described fully in connection with the circuit arrangement of FIGURE 1 of the drawings. During operation of the circuit of FIGURE 12 to pump power back into the power source $E_s$, the feedback diode 97 will serve to circulate the feedback current into the power source in the normal manner of a coasting rectifier.

From the foregoing description, it can be appreciated that the present invention makes available to industry a whole family of new and improved flyback power amplifier circuit arrangements which employ triacs, diacs, *dv/dt* fired SCR's, and gate turn-off silicon control switches as the power switching elements. By reason of the provision of this family of new and improved flyback power amplifier circuit arrangements, entirely new power sources are made available for use in applications which heretofore could not employ solid state static power sources because of cost, circuit complexity, and other factors which rendered the predecessors of the present family of circuits impractical.

Having described several embodiments of a new and improved flyback power amplifier circuit constructed in accordance with the present invention, it is believed obvious that other modifications and variations of the invention are possible in light of the above teachings. It is therefore to be understood that changes may be made in the particular embodiments of the invention described which are within the full intended scope of the invention as defined by the appended claims.

What I claim as new and desire to secure by Letters Patent of the United States is:

1. A new and improved flyback power amplifier circuit including in combination a linear inductance, a triac bidirectional conducting device for controlling current flow through the linear inductance in two directions, and a load all connected in series circuit relationship across a pair of power supply terminals that in turn are adapted to be connected across a source of electric potential, a second triac bidirectional conducting device connected in parallel circuit relationship with the series connected first-mentioned triac bidirectional conducting device and the load, first and second gating signal means respectively coupled to the control gates of said triac bidirectional conducting devices for respectively turning on said devices to cause them to conduct current therethrough in either direction depending upon the polarity of the potentials across the devices, first and second commutating circuit means respectively connected across the load terminals of said triac bidirectional conducting devices for respectively turning off the devices after predetermined intervals of conduction in at least one direction, and a filter capacitor connected in parallel circuit relationship with the load.

2. The combination set forth in claim 1 further characterized by lockout circuit means interconnected between the respective commutation circuit means and the control gates of each of said triac bidirectional conducting devices for locking out the control gate during commutation intervals of the respective commutation circuit means.

3. The combination set forth in claim 1 wherein the second triac bidirectional conducting device is connected to an intermediate tap point of the linear inductance so as to be effectively connected in parallel circuit relationship with the load, the first-mentioned triac bidirectional conducting device and a portion only of the windings of the linear inductance.

4. The combination set forth in claim 1 wherein the second triac bidirectional conducting device is connected to an intermediate tap point of the linear inductance so that it is effectively connected in parallel circuit relationship with the load, the first-mentioned triac bidirectional conducting device and a portion only of the windings of the linear inductance, and wherein the circuit combination is further characterized by lockout circuit means interconnected between the commutation circuit means and the gating electrode of each of the triac bidirectional conducting devices for locking out the control gate of the respective triac bidirectional conducting device during the commutating intervals of the respective commutation circuit means associated therewith.

5. A new and improved flyback power amplifier circuit including in combination a linear inductance, a first pair of gate turn-on, gate turn-off silicon control switches connected in parallel circuit relationship in a reverse polarity sense, the first pair of parallel connected silicon control switches being connected in series circuit relationship with a load and the linear inductance across a pair of power supply terminals that in turn are adapted to be connected across a source of electric potential, a second pair of gate turn-on, gate turn-off silicon control switches connected in parallel circuit relationship in a reverse polarity sense, the second pair of parallel connected silicon control switches being connected in parallel circuit relationship with the series connected first-mentioned pair of parallel connected silicon control switches and the load, separate means for respectively turning each of said gate turn-on, gate turn-off silicon control switches on and off at desired intervals, and a filter capacitor connected in parallel circuit relationship with the load.

6. A new and improved flyback power amplifier circuit including in combination a linear inductance, a first diac bidirectional conducting device for controlling current flow therethrough in two directions, and a load all connected in series circuit relationship across a pair of power supply terminals that in turn are adapted to be connected across a source of electric potential, a second diac bidirectional conducting device connected in parallel circuit relationship with the series connected first diac bidirectional conducting device and the load, separate first gating circuit means connected across the load terminals of each of said diac bidirectional conducting devices for respectively turning on the devices to cause them to conduct current in a first direction, separate second gating circuit means connected across the load terminals of each of said diac bidirectional conducting devices for respectively turning on said devices to cause them to conduct current in a second reverse direction, the direction of current conduction being dependent upon the polarity of the potentials across the diac devices, separate commutating circuit means respectively coupled across the load terminals of each of said diac bidirectional conducting devices for commutating off the device after a predetermined period of conduction in at least one direction, and a filter capacitor connected in parallel circuit relationship with the load.

7. The combination set forth in claim 6 further characterized by separate blocking circuit means interconnecting the commutating circuit means and the second gating circuit means associated with each of the diac bidirectional conducting devices for rendering the second gating circuit means ineffective during the commutating intervals of the respective commutation circuit means.

8. A new and improved flyback power amplifier circuit including in combination a linear inductance, a first *dv/dt* fired silicon controlled rectifier device having its gate open-circuited and having a feedback diode connected across it in parallel circuit relationship in a reverse polarity sense, and a load all connected in series circuit relationship across a pair of power supply terminals that in turn are adapted to be connected across a source of electric potential, a second *dv/dt* fired silicon controlled rectifier device having a feedback diode connected across it in parallel circuit relationship in a reverse polarity sense, the second

*dv/dt* fired silicon controlled rectifier device and associated feedback diode being connected in parallel circuit relationship with the series connected first-mentioned *dv/dt* fired silicon controlled rectifier device and the load, first and second gating circuit means respectively connected across the load terminals of each of the *dv/dt* fired silicon controlled rectifier devices for respectively turning on the devices to cause them to conduct current in one direction, first and second commutation circuit means respectively connected across the load terminals of each of the *dv/dt* fired silicon controlled rectifier devices for respectively commutating off the devices after predetermined periods of conduction, and a filter capacitor connected in parallel circuit relationship with the load.

9. A new and improved flyback power amplifier circuit including in combination a linear inductance, first conductivity controlled solid state bidirectional conducting means for controlling current flow therethrough in two directions, and a load all connected in series circuit relationship across a source of electric potential, second conductivity controlled solid state bidirectional conducting means connected in parallel circuit relationship with the series connected first-mentioned conductivity controlled bidirectional conducting means and the load, a filter capaciter connected in parallel circuit relationship with the load, first means for turning said second bidirectional conducting means on and off at desired intervals to conduct current therethrough in two directions according to the potentials thereacross to effect charging of the linear inductance in a first mode of operation of the circuit and discharging of the linear inductance through the power supply terminals for return of power from the load to the source of electric potential in a second mode of operation of the circuit, and second means for turning said first bidirectional conducting means on and off at desired intervals to conduct current therethrough in two directions according to the potentials thereacross to effect discharging of the linear inductance through the load in the first mode of operation and charging of the linear inductance in the second mode of operation.

References Cited

UNITED STATES PATENTS

| | | | |
|---|---|---|---|
| 3,174,096 | 3/1965 | Lichowsky | 307—88.5 |
| 3,263,099 | 7/1966 | Bedford | 307—109 |

FOREIGN PATENTS

| | | | |
|---|---|---|---|
| 945,249 | 12/1963 | Great Britain | 317—235 |

JOHN W. HUCKERT, *Primary Examiner.*

J. D. CRAIG, *Assistant Examiner.*